United States Patent [19]

Dijkmans

[11] Patent Number: 5,418,493

[45] Date of Patent: May 23, 1995

[54] DIFFERENTIAL AMPLIFIER WITH COMMON-MODE REJECTION

[75] Inventor: Eise C. Dijkmans, Eindhoven, Netherlands

[73] Assignee: U.S. Philips Corporation, New York, N.Y.

[21] Appl. No.: 185,637

[22] Filed: Jan. 24, 1994

[30] Foreign Application Priority Data

Jan. 26, 1993 [EP] European Pat. Off. ............ 93200179

[51] Int. Cl.6 ............................................. H03F 3/45
[52] U.S. Cl. .................................... 330/253; 330/258; 330/311
[58] Field of Search ....................... 330/253, 258, 311

[56] References Cited

U.S. PATENT DOCUMENTS 5,166,635  11/1992  Shih ............................... 330/258 X

FOREIGN PATENT DOCUMENTS 0325299  7/1989  European Pat. Off. .

OTHER PUBLICATIONS

S. J. Daubert, "A Transistor-Only Current-Mode Sigma Delta Modulator", IEEE Journal of Solid State Circuits, vol. 27, No. 5, May 1992, pp. 821–830.

Primary Examiner—James B. Mullins
Attorney, Agent, or Firm—Laurie Gathman

[57] ABSTRACT

A differential amplifier with common-mode rejection has input transistors (T1, T2) whose drains are coupled to a first output terminal (10) and a second output terminal (12), respectively, and to the drains of current-source transistors (T3, T4) whose sources are each connected to a supply terminal (18) via a parallel arrangement of two control transistors (T5A/T6A, T5B/T6B) in order to reject the common-mode component at the output terminals (10, 12). Of each pair of control transistors the gate of the one transistor (T5A, T5B) is coupled to the first output terminal (10) and the gate of the other transistor (T5B, T6B) is coupled to second output terminal (12).

8 Claims, 5 Drawing Sheets

DIFFERENTIAL AMPLIFIER WITH COMMON-MODE REJECTION

FIELD OF THE INVENTION

The invention relates to a differential amplifier with common-mode rejection, comprising:
a differential pair comprising a first and a second transistor having their first main electrodes coupled to one another,
means coupled to the first main electrodes to supply a bias current to the differential pair,
a first and a second output terminal, coupled to a second main electrode of the first and the second transistor, respectively,
a supply terminal and a reference voltage source for generating a reference voltage relative to the supply terminal,
a third and a fourth transistor, each having a first main electrode, a second main electrode and a control electrode, the second main electrode of the third and the fourth transistor being coupled to the first and the second output terminal, respectively, and the control electrodes of the third and the fourth transistor being coupled to the reference voltage source,
a fifth and a sixth transistor, each having a first main electrode, a second main electrode and a control electrode, the first and the second main electrode of the fifth transistor being connected to the supply terminal and the first main electrode of the third transistor, respectively, the first and the second main electrode of the sixth transistor being coupled to the supply terminal and the first main electrode of the fourth transistor, respectively, and the control electrodes of the fifth and the sixth transistor being coupled to the first and the second output terminal, respectively.

BACKGROUND OF THE INVENTION

Such a differential amplifier is known, inter alia from European Patent Application EP 0,325,299, in particular FIG. 1 thereof, and from an article "A Transistor-Only Current-Mode Sigma Delta Modulator", S. J. Daubert et al, IEEE Journal of Solid State Circuits, Vol. 27, No. 5, May 1992, pp. 821-830, in particular FIG. 6 thereof. In the differential amplifier disclosed in said European Patent Application the first (MN101) and the second (MN102) transistor of the differential pair are coupled to the output terminals (107/108) via a first set of cascode transistors (MP101) and the third (MN105) and the fourth (MN206) transistor are coupled to the output terminals via a second set of cascode transistors (MN103/MN104). In the differential amplifier known from the article the first (M1) and the second (M2) transistor of the differential pair and the third (M20) and the fourth (M21) transistor are coupled to the output terminals (outp/outn) via the same set of cascode transistors (M16/M17). However, in both prior-art differential amplifiers the first main electrodes of the third and the fourth transistor are interconnected, the node thus formed being connected to the supply terminal via the parallel-connected main current paths of the fifth and the sixth transistor. The third and the fourth transistor are arranged as a current source and present a high-impedance load to the first and the second transistor of the differential pair. At the output terminals the differential pair produces output voltages whose common-mode component is suppressed by means of the fifth and the sixth transistor, which are operated as controllable resistances and which have their control electrodes coupled to the output terminals for controlling the resistance. In the prior-art differential amplifiers a simultaneous increase of the output voltages will cause the resistance of the fifth and the sixth transistor to decrease simultaneously, as result of which the voltage on the node between the third and the fourth transistor will decrease. Since the control electrodes of the third and the fourth transistor are connected to a fixed reference voltage the decrease of the voltage on the node will cause the current in the third and the fourth transistor to increase. This current increase compensates for the common-mode increase of the output voltages. The differential-mode component of the output voltages is not affected because in that case the resistance increase of, for example, the fifth transistor is cancelled by the resistance decrease of the sixth transistor, as a result of which the parallel resistance of the fifth and the sixth transistor remains virtually constant.

The third and the fourth transistor each introduce a noise current in the output terminals. It may be assumed that the noise current is caused by an equivalent noise voltage source in series with the control electrodes of the third and the fourth transistor. At the output terminals the equivalent noise voltage source of the third transistor produces a differential noise current whose magnitude is determined inter alia by the impedance effectively seen by the second main electrode of the third transistor. This impedance is equal to approximately twice the inverse of the transconductance of the third transistor because the first main electrodes of the third and the fourth transistor are interconnected. The same applies to the differential noise current caused by the fourth transistor. The effective impedance is comparatively low and the differential noise contribution of the third and the fourth transistor to the output signal of the prior-art differential amplifier is comparatively high. Increasing the effective impedance by arranging additional resistors in series with the first main electrodes of the third and the fourth transistor does reduce the gain of the noise voltage on the control electrodes of these transistors but it also reduces the effect of the common-mode rejection of the fifth and the sixth transistor operating as a controllable resistance.

SUMMARY OF THE INVENTION

It is an object of the invention to provide a differential amplifier with common-mode rejection in which the differential noise contribution of the third and the fourth transistor to the output signal is reduced whilst the common-mode effect is preserved.

To achieve this, in accordance with the invention, a differential amplifier with common-mode rejection of the type defined in the opening paragraph is characterized in that the differential amplifier further comprises a further fifth transistor having a control electrode, a first main electrode and a second main electrode, of which the control electrode is coupled to the first output terminal, and of which the first main electrode is coupled to the supply terminal and the second main electrode to the first main electrode of the fourth transistor, and a further sixth transistor having a control electrode, a first main electrode and a second main electrode, of which the control electrode is coupled to the second output terminal, and of which the first main electrode is coupled to the supply terminal and the second main electrode to the first main electrode of the third transistor.

Now the first main electrodes of the third and the fourth transistor are not interconnected. By adding the further fifth transistor and the further sixth transistor the fifth and the sixth transistor may be regarded as transistors which have each been divided into two transistors, one arranged in series with the third transistor and the other in series with the fourth transistor. The control electrodes of the divided fifth transistor are coupled to the first output terminal and the control electrodes of the divided sixth transistor are coupled to the second output terminal. Thus, the third and the fourth transistor have an individual common-mode control whose effect is similar to the effect of the known common-mode control. However, the impedance seen by the first main electrode of both the third and the fourth transistor has now increased and is now equal to one time the inverse of the transconductance of the third or the fourth transistor plus twice the resistance represented by the original fifth and sixth transistor connected in parallel. This results in a substantial reduction of the gain of the equivalent noise voltage on the control electrodes of the third and the fourth transistor. The additional noise currents in the output terminals caused by the divided fifth and sixth transistor are considerably smaller than the noise contributions of the third and the fourth transistor and may be ignored.

BRIEF DESCRIPTION OF THE DRAWINGS

These and other aspects of the invention will be described and clarified with reference to the accompanying drawings, in which.

In these Figures elements having the same function or purpose bear the same references.

DETAILED DESCRIPTION OF THE PREFERRED EMBODIMENTS

Figure 1:
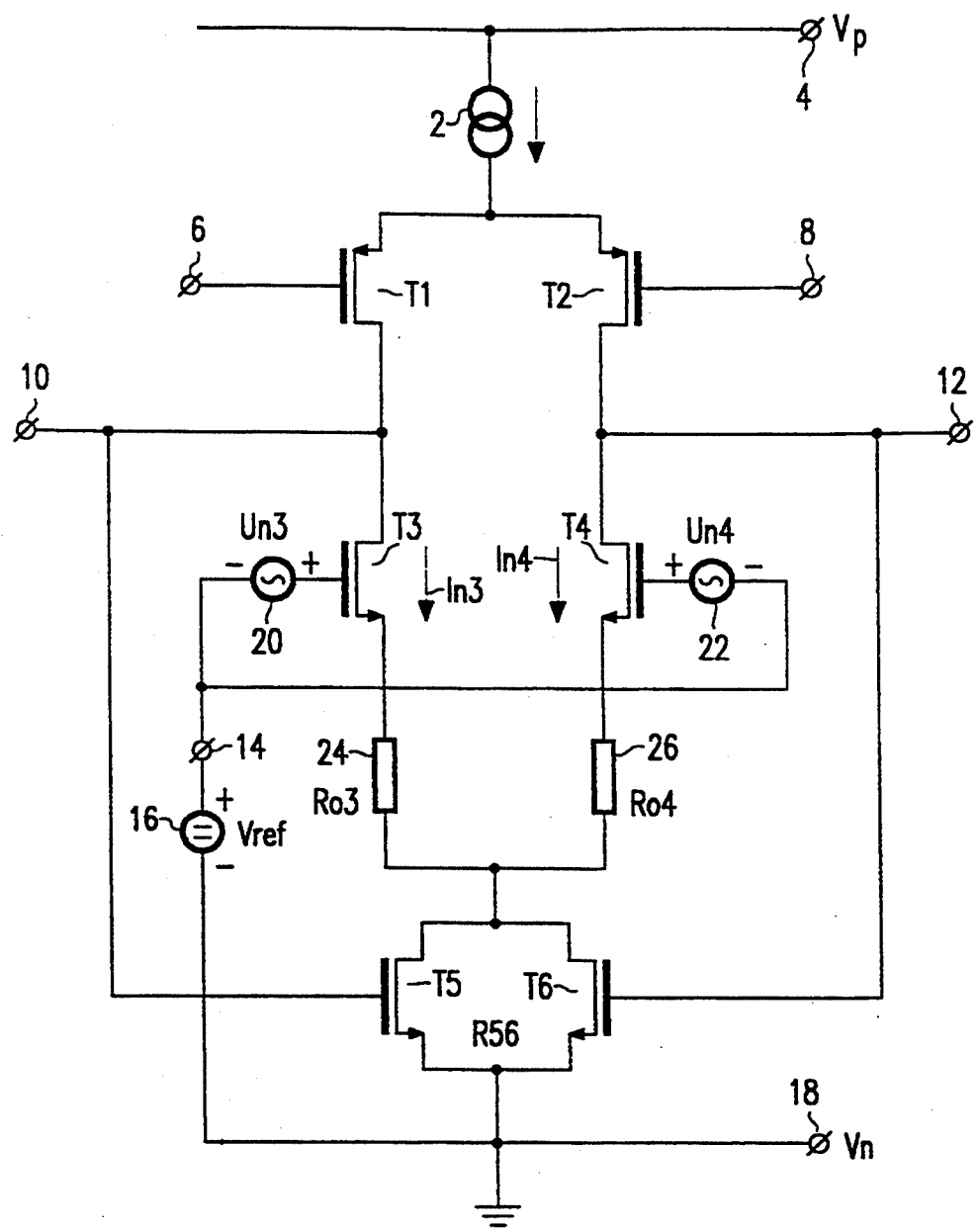
FIG. 1 shows a prior-art differential amplifier with common-mode rejection and MOS transistors.

FIG. 1 shows a prior-art differential amplifier with common-mode rejection. The PMOS transistors T1 and T2 are arranged as a differential pair, the first main electrodes or sources being connected to a positive supply terminal 4 via a current source 2. The control electrodes or gates of the transistors T1 and T2 are connected to input terminals 6 and 8 for receiving an input signal. The second main electrodes or drains of the transistors T1 and T2 are coupled to the output terminals 10 and 12, respectively, and to the drains of the NMOS transistors T3 and T4, respectively. The gates of the transistors T3 and T4 are connected to a reference voltage terminal 14 which is connected to a reference voltage source 16, which generates a reference voltage Vref relative to the negative supply terminal 18. T3 and T4 are arranged as a current source and present a high-impedance load to the transistors T1 and T2 of the differential pair. The sources of the transistors T3 and T4 are interconnected and their node is connected to the negative supply terminal 18 via a parallel arrangement of two NMOS transistors T5 and T6, which have their sources connected to the negative supply terminal 18, their drains to said node, and their gates to the output terminal 10 and 12, respectively. The transistors T5 and T6 operate as a controllable resistance and are biased in the linear region of the characteristic defining the relationship between the drain current and the gate-source voltage. A simultaneous increase of the voltage on the output terminals 10 and 12 will result in a simultaneous decrease of the resistance of the transistors T5 and T6. As a result of this, the voltage on the node will decrease and the effective gate-source voltage of the transistors T3 and T4 will increase, causing the currents through the transistors T3 and T4 to increase. This current increase will result in a decrease of the voltage on the output terminals 10 and 12. A change in the common-mode voltage on the output terminals 10 and 12 is thus suppressed. A differential-mode voltage on the output terminals 10 and 12 is not suppressed because, for example, an increase of the voltage on the output terminal 10 and a decrease of the voltage on the output terminal 12 results in a decrease of the resistance of the transistor T5 and an increase of the resistance of the transistor T6, the parallel resistance of the transistors T5 and T6 changing hardly or not at all.

The transistors T3 and T4 cause noise currents In3 and In4 generated by noise sources which are assumed to be concentrated in the equivalent noise voltage sources 20 and 22 in series with the gates of the transistors T3 and T4. The noise voltage source 20 supplies a noise voltage Un3, which is converted into a noise current In3. The magnitude of the noise current In3 depends inter alia on the impedance seen by the source of the transistor T3. This impedance is equal to Ro3+Rp, Rp being the parallel resistance of Ro4 and R56, Ro4 being the output resistance of the transistor T4, and R56 being the parallel resistance of the transistors T5 and T6. The output resistance Ro3 is equal to $1/g_m$ of the transistor T3, $g_m$ being the slope or transconductance of the transistor T3. The noise current In3 flows partly to the negative supply terminal 18, the remainder flowing through the transistor T4 and thereby producing a differential-mode noise current at the outputs 10 and 12. A similar effect is produced by the noise of the transistor T4 and the overall differential-mode noise current is the sum of the contributions of the transistors T3 and T4. Any noise produced by the transistors T5 and T6 will be distributed equally between the transistors T3 and T4, resulting in a common-mode noise current at the output terminals 10 and 12, which common mode noise current is suppressed.

Figure 2:
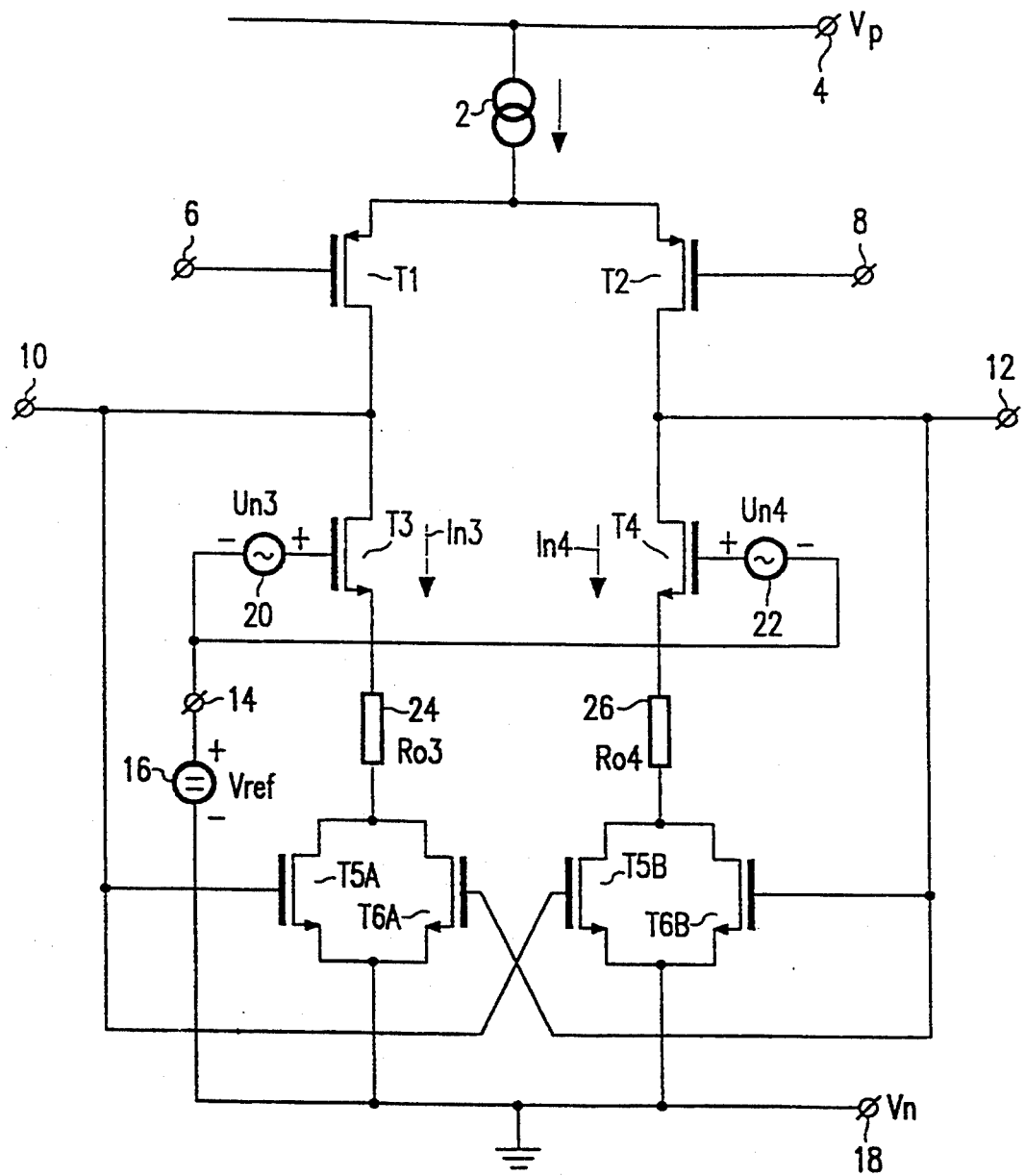
FIG. 2 shows a differential amplifier with common-mode rejection and MOS transistors in accordance with the invention.

In order to reduce the undesired differential-mode noise currents of the transistors T3 and T4, in accordance with the invention, the transistors T5 and T6 are each divided into two transistors and the connection between the sources of the transistors T3 and T4 is interrupted. This is shown in FIG. 2. The transistor T5 is divided into a transistor T5A in series with the transistor T3 and a transistor T5B in series with the transistor T4, the gates of the two transistors T5A and T5B being connected to the output terminal 10. The transistor T6 is divided into a transistor T6A in series with the transistor T3 and a transistor T6B in series with the transistor T4, the gates of the two transistors T6A and T6B being connected to the output terminal 12. The transistors T5A and T5B can be formed by halving the original transistor T5, the sub-transistors each being given half the original transistor area, although this is not necessary. The same applies to the transistors T6A and T6B. The result of this step is that the impedance seen by the sources of the transistors T3 and T4 is increased considerably, the effect of the common-mode rejection of the transistors T5 and T6 being preserved. When the transistors T5 and T6 are halved the individual transistors T5A, T5B, T6A and T6B will each have a resistance equal to twice the resistance of the original transistors T5 and T6. The resistance value of the parallel-connected transistors T5A and T6A is now doubled but the current through these transistors is halved, so that the voltage on the source of the transistor T3 has not changed. However, alternatively the voltage Vref of the reference voltage source 16 can be adapted. The source of the transistor T3 now sees Ro3 plus the parallel resistance of the transistors T5A and T6A which, as already stated, can be equal to twice the original parallel resistance of the transistors T5 and T6. Moreover, since there is no connection between the sources of the transistors T3 and T4, the noise current In3 no longer flows to the transistor T4 via the output resistor 26. The effective transconductance of the transistors T3 and T4 is reduced considerably, resulting in a substantial reduction of the differential-mode noise currents in the output terminals.

Figure 3:
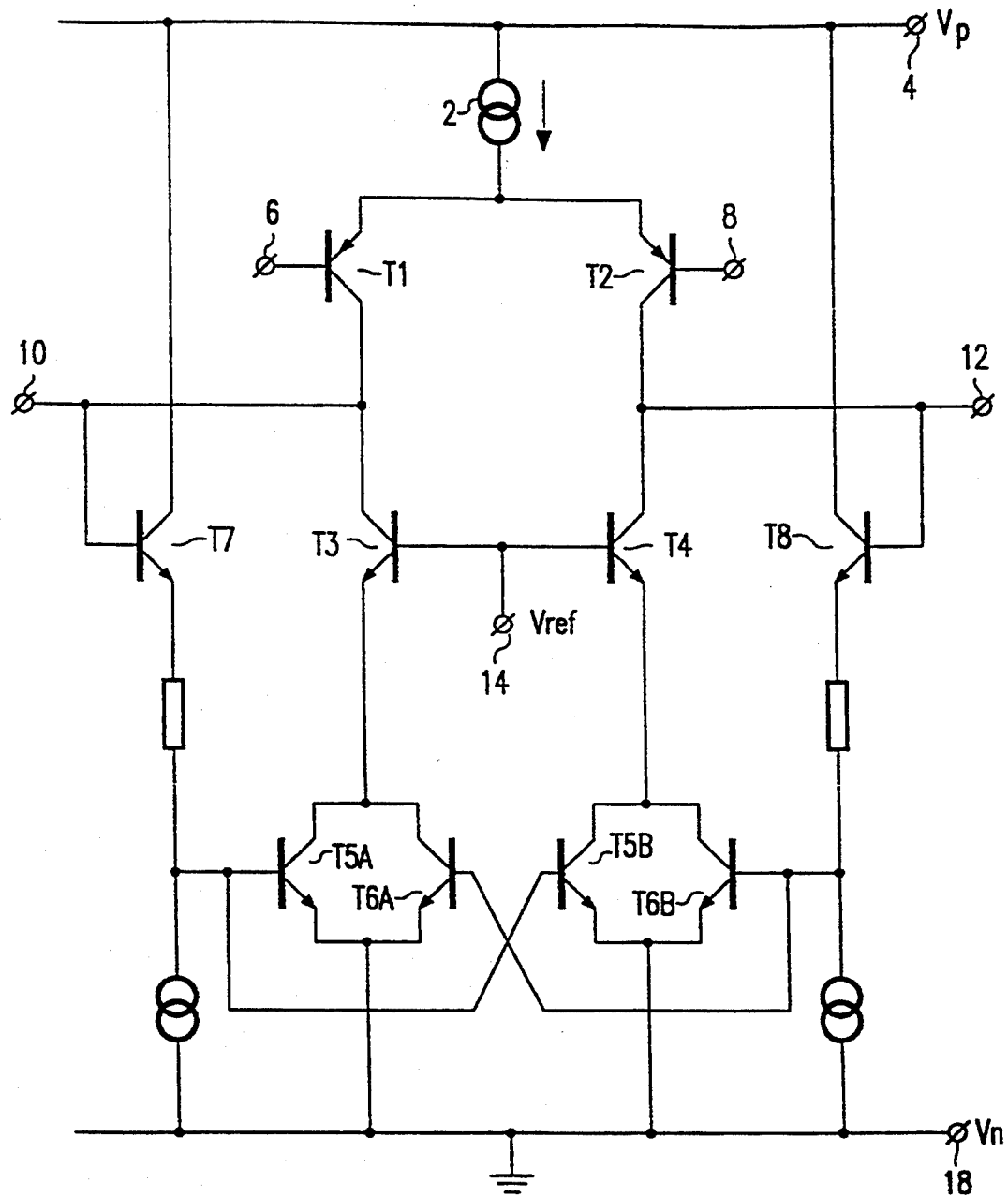
FIG. 3 shows a differential amplifier with common-mode rejection and bipolar transistors in accordance with the invention.

Alternatively, as is shown in FIG. 3, the circuit arrangement shown in FIG. 2 can be constructed by means of bipolar transistors, the bases, emitters and collectors taking the place of the gates, sources and drains of the MOS transistors. In the present case the bases of the bipolar transistors T5A/T5B and T6A/T6B are connected to the outputs 10 and 12, respectively, via level-shifting transistors T7 and T8 in order to operate the transistors T5A/T5B and T6A/T6B in the correct region.

Figure 4:
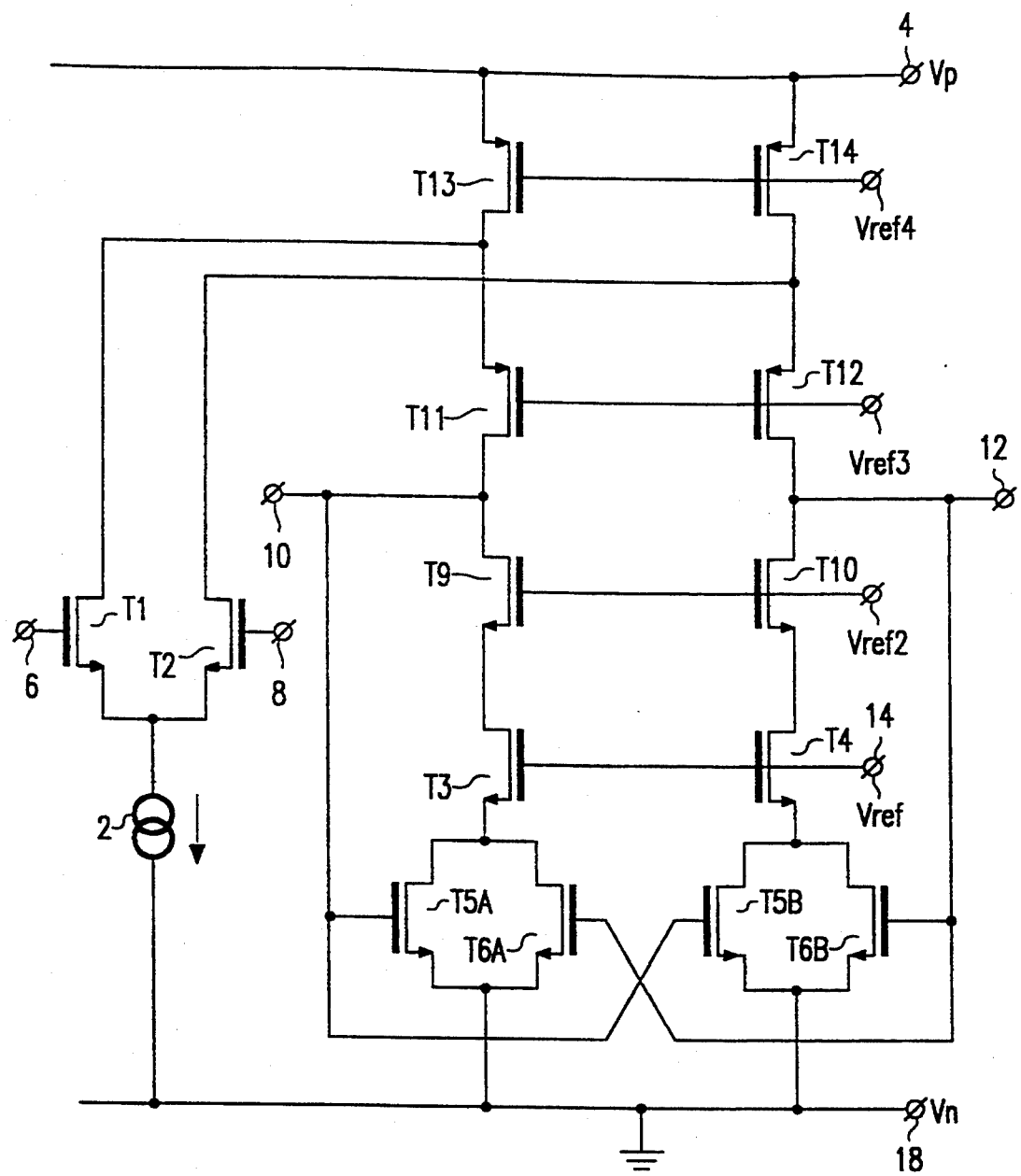
FIG. 4 shows a first more elaborate differential amplifier with common-mode rejection and MOS transistors in accordance with the invention.

FIG. 4 shows a more elaborate differential amplifier with common-mode rejection in accordance with the invention. The NMOS transistors T3 and T4 are coupled to the output terminals 10 and 12 via NMOS transistors T9 and T10, whose gates receive a reference voltage Vref2. In the present case the transistors T1 and T2 are NMOS transistors whose sources are connected to the negative supply terminal 18 via the current source 2 and whose drains are coupled to the output terminals 10 and 12 via PMOS transistors T11 and T12, whose gates receive a reference voltage Vref3. In their turn, the sources of the transistors T11 and T12 are coupled to the positive supply terminal 4 via PMOS transistors T13 and T14, whose gates receive a reference voltage Vref4.

Figure 5:
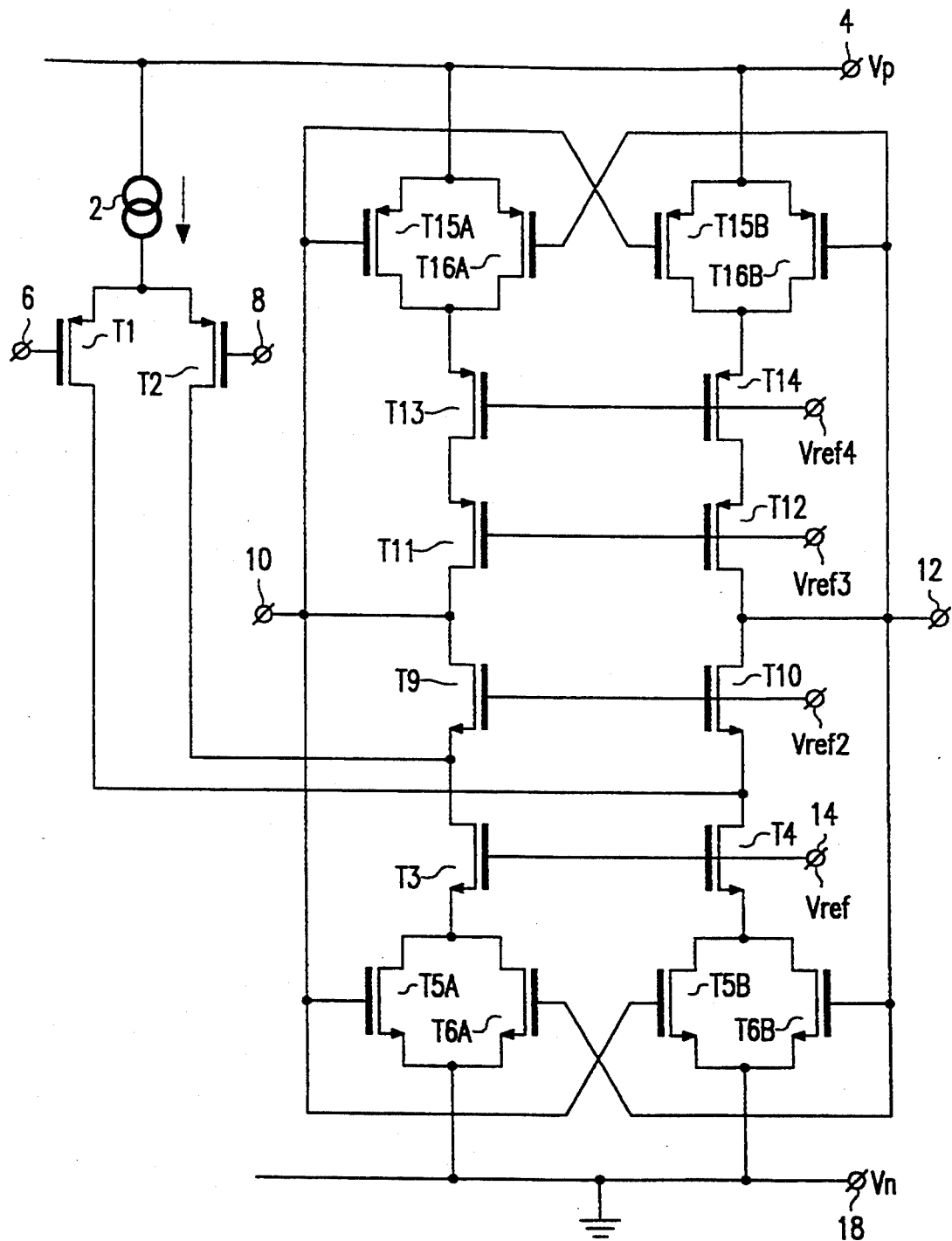
FIG. 5 shows a second more elaborate differential amplifier with common-mode rejection and MOS transistors in accordance with the invention.

FIG. 5 shows another more elaborate differential amplifier with common-mode rejection in accordance with the invention. In the present case the transistors T1 and T2 are PMOS transistors whose sources are connected to the positive supply terminal 4 via the current source 2 and whose drains are connected to the drains of the transistors T3 and T4, respectively. For the remainder, the circuit arrangement is similar to that shown in FIG. 4, albeit that now the sources of the PMOS transistors T13 and T14 are not connected directly to the positive supply terminal but via PMOS transistor pairs T15A/T16A and T15B/T16B, which are complementary to the transistor pairs T5A/T6A and T5B/T6B and perform the same function. It is to be noted that of the PMOS pairs and the NMOS pairs one pair may be dispensed with, if desired.

I claim:

1. A differential amplifier with common-mode rejection, comprising:
   a differential pair comprising a first and a second transistor, each transistor having a first main electrode and a second main electrode, the first main electrodes being coupled to one another,
   bias means coupled to the first main electrodes for supplying a bias current to the differential pair,
   a first and a second output terminal, coupled to the second main electrodes of the first and the second transistor, respectively,
   a supply terminal and a reference voltage source for generating a reference voltage relative to the supply terminal,
   a third and a fourth transistor, each having a first main electrode, a second main electrode and a control electrode, the second main electrodes of the third and the fourth transistor being coupled to the first and the second output terminal, respectively, and the control electrodes of the third and the fourth transistor being coupled to the reference voltage source,
   a fifth and a sixth transistor, each having a first main electrode, a second main electrode and a control electrode, the first and the second main electrodes of the fifth transistor being connected to the supply terminal and the first main electrode of the third transistor, respectively, the first and the second main electrodes of the sixth transistor being coupled to the supply terminal and the first main electrode of the fourth transistor, respectively, and the control electrodes of the fifth and the sixth transistor being coupled to the first and the second output terminal, respectively, characterized in that the differential amplifier further comprises (1) a further fifth transistor having a control electrode, a first main electrode and a second main electrode, of which the control electrode of the fifth transistor is coupled to the first output terminal, and of which the first main electrode of the fifth transistor is coupled to the supply terminal and the second main electrode of the fifth transistor is coupled to the first main electrode of the fourth transistor, and (ii) a further sixth transistor having a control electrode, a first main electrode and a second main electrode, of which the control electrode of the sixth transistor is coupled to the second output terminal, and of which the first main electrode of the sixth transistor is coupled to the supply terminal and the second main electrode of the sixth transistor is coupled to the first main electrode of the third transistor.

2. The differential amplifier according to claim 1, wherein the first and the second transistors are PMOS type transistors, and the third, the fourth, the fifth, the further fifth, the sixth and the further sixth transistors are all NMOS type transistors.

3. The differential amplifier according to claim 1, wherein the first and second transistors are bipolar PNP transistors and the third, the fourth, the fifth, the further fifth, the sixth and the further sixth transistors are all bipolar NPN transistors.

4. The differential amplifier according to claim 3, further including
   a positive supply terminal; and a seventh and an eighth transistor each having a first main electrode, a second main electrode and a control electrode, the control electrodes of the seventh and eighth transistors being coupled to the first and the second output terminals, respectively, the second main electrodes of the seventh and eighth transistors being coupled to the positive supply terminal, the first main electrode of the seventh transistor being coupled between the control electrode of the fifth transistor and the first output terminal, the first main electrode of the eighth transistor being coupled between the control electrode of the sixth transistor and the second output terminal.

5. The differential amplifier according to claim 4, wherein the seventh and the eight transistors are NPN bipolar transistors.

6. The differential amplifier according to claim 1, further including a positive supply terminal;

a ninth transistor, a tenth transistor, an eleventh transistor, a twelfth transistor, a thirteenth transistor, and a fourteenth transistor, each having a first main electrode, a second main electrode and a control electrode;

a second voltage reference source coupled to the control electrodes of the ninth and tenth transistors;

a third voltage reference source coupled to the control electrodes of the eleventh and twelfth transistors; and a fourth voltage reference source coupled to the control electrodes of the thirteenth and fourteenth transistors;

the first main electrodes of the thirteenth and fourteenth transistors being coupled to the positive supply terminal, the second main electrodes of the thirteenth and the fourteenth transistors being coupled to the second main electrodes of the first and second transistors, respectively, and to the first main electrodes of the eleventh and twelfth transistors, respectively, the second main electrodes of the eleventh and twelfth transistors being coupled to the second main electrodes of the ninth and tenth transistors, respectively, and to the first and second output terminals, respectively, the first main electrodes of the ninth and tenth transistors being coupled to the second main electrodes of the third and fourth transistors, respectively.

7. The differential amplifier according to claim 6, wherein the eleventh, the twelfth, the thirteenth and the fourteenth transistors are all PMOS type transistors and the first, the second, the third, the fourth, the fifth, the further fifth, the sixth, the further sixth, the ninth and the tenth transistors are all NMOS type transistors.

8. The differential amplifier according to claim 6, further including a fifteenth, a further fifteenth, a sixteenth and a further sixteenth transistor each having a first main electrode, a second main electrode and a control electrode, the fifteenth and the sixteenth transistors being coupled between the first main electrode of the thirteenth transistor and the positive supply terminal, the further fifteenth and the further sixteenth transistors being coupled between the first main electrode of the fourteenth transistor and the positive supply terminal, the control electrodes of the sixteenth and further sixteenth transistors being coupled to the second output terminal, the control electrodes of the fifteenth and further fifteenth transistors being coupled to the first output terminal.

* * * * *